United States Patent
Hodel et al.

(10) Patent No.: US 10,613,891 B2
(45) Date of Patent: Apr. 7, 2020

(54) SYSTEM AND METHOD FOR USING VIRTUAL MACHINE OPERATOR MODEL

(71) Applicant: Caterpillar Inc., Peoria, IL (US)

(72) Inventors: Benjamin John Hodel, Dunlap, IL (US); Matthew James Lossmann, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 183 days.

(21) Appl. No.: 15/849,891

(22) Filed: Dec. 21, 2017

(65) Prior Publication Data
US 2019/0196854 A1      Jun. 27, 2019

(51) Int. Cl.
| | | |
|---|---|---|
| *G06F 9/46* | (2006.01) | |
| *G06F 9/455* | (2018.01) | |
| *G06N 3/08* | (2006.01) | |
| *G06F 17/50* | (2006.01) | |
| *G06N 3/00* | (2006.01) | |
| *G06N 3/04* | (2006.01) | |

(52) U.S. Cl.
CPC ...... *G06F 9/45558* (2013.01); *G06F 17/5009* (2013.01); *G06N 3/006* (2013.01); *G06N 3/086* (2013.01); *G06N 3/04* (2013.01)

(58) Field of Classification Search
CPC .............. G06F 9/45558; G06F 17/5009
See application file for complete search history.

(56) References Cited

U.S. PATENT DOCUMENTS

| | | | | |
|---|---|---|---|---|
| 7,908,928 | B2 | 3/2011 | Vik | |
| 2001/0044789 | A1* | 11/2001 | Widrow | G06N 3/061 |
| | | | | 706/14 |
| 2015/0007177 | A1* | 1/2015 | Tobo | G06F 9/45533 |
| | | | | 718/1 |

FOREIGN PATENT DOCUMENTS

| | | |
|---|---|---|
| CN | 106372581 A | 2/2017 |
| WO | 2006116758 A2 | 2/2006 |
| WO | 2017035461 A1 | 2/2017 |

* cited by examiner

*Primary Examiner* — Camquy Truong
(74) *Attorney, Agent, or Firm* — Sucheta Chitgopekar

(57) ABSTRACT

A method of using a virtual machine operator model includes providing a virtual machine operating environment having a current state and including a virtual machine and a virtual operator agent acting within the virtual machine operating environment. The method also includes executing a control action, by the virtual operator agent, relative to the virtual machine based on the virtual machine operator model. The method also includes analyzing a new state of the virtual machine operating environment resulting from execution of the control action, assigning a positive reward or a negative reward to the control action based on the new state, assigning the negative reward to the control action resulting in a high implement jerk movement of the virtual machine, and executing a learning algorithm to update the virtual machine operator model based on the positive reward or the negative reward.

20 Claims, 6 Drawing Sheets

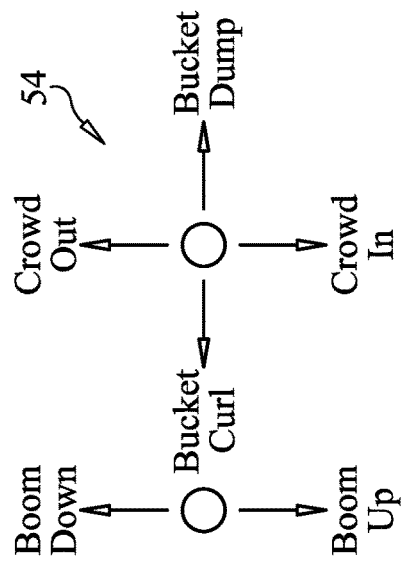
FIG. 4
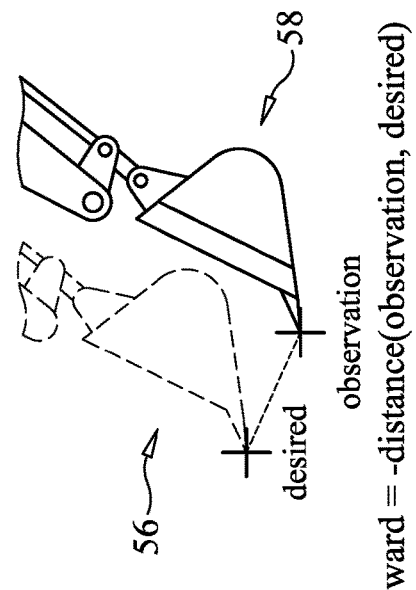
FIG. 6
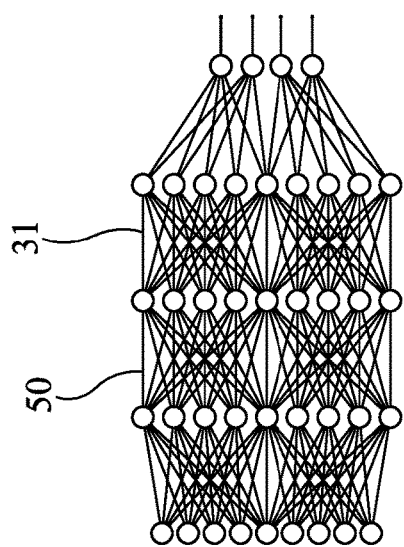
FIG. 3
FIG. 5

SYSTEM AND METHOD FOR USING VIRTUAL MACHINE OPERATOR MODEL

TECHNICAL FIELD

The present disclosure relates generally to virtual environments for testing machines and, more particularly, to a system and method for using a virtual machine operator model.

BACKGROUND

Product development of machines, including large, heavy earthmoving machines, often benefits from running virtual simulations of new designs before any prototypes or production machines are built. By evaluating the performance and durability of machine systems and components, such as, for example, the engine, structures, powertrain, and hydraulic implements using only a virtual model, designs can be optimized before any physical parts are actually constructed or assembled. It is important, however, that the simulation is operated in a way that is representative of human operators.

Traditional development of operator models has focused on rule-based logic or the use of proportional-integral-derivative (PID) controllers applied to a state machine. Simple rule-based models, however, are often brittle and become unsatisfactory when the design parameters of the machine or the boundary conditions of the simulation are changed. PID controllers require manual tuning and suffer sensitivity to the initial simulation parameters. As such, robust human-like trajectories are hard to achieve.

There are advanced control methods which are better suited for complicated behavior by imposing a more complex control structure on the flow of data. However, these advanced control methods require careful design and control theory expertise to tune them correctly. In some cases, they require complete knowledge of the system dynamics or do not guarantee transient learning behavior. Besides model complexities, some simulation scenarios are virtually impossible to control due to the chaotic system dynamics. Thus, using or creating operator models that mimic human behavior is difficult using conventional techniques.

U.S. Pat. No. 7,761,269 to Kraal et al. discusses a system for subjective evaluation of a vehicle design within a virtual environment. The system includes a scalable physical property representative of the vehicle design and a computer system for digitally creating a virtual environment having a virtual human immersed within. The system also includes a motion capture system for sensing a motion of an evaluator and communicating the sensed motion of the evaluator to the computer system and a virtual reality display mechanism for providing the evaluator a view of the virtual environment while evaluating the vehicle design.

SUMMARY OF THE INVENTION

In one aspect, a method for using a virtual machine operator model includes providing a virtual machine operating environment having a current state and including a virtual machine and a virtual operator agent acting within the virtual machine operating environment. The method also includes executing a control action, by the virtual operator agent, relative to the virtual machine based on the virtual machine operator model. The method further includes analyzing a new state of the virtual machine operating environment resulting from execution of the control action, assigning a positive reward or a negative reward to the control action based on the new state, assigning the negative reward to the control action resulting in a high implement jerk movement of the virtual machine, and executing a learning algorithm to update the virtual machine operator model based on the positive reward or the negative reward.

In another aspect, a system for using a virtual machine operator model includes a controller programmed to provide a virtual machine operating environment having a current state and including a virtual machine and a virtual operator agent acting within the virtual machine operating environment. The controller is also programmed to execute a control action, by the virtual operator agent, relative to the virtual machine based on the virtual machine operator model, and analyze a new state of the virtual machine operating environment resulting from execution of the control action. The controller is further programmed to assign a positive reward or a negative reward to the control action based on the new state, assign the negative reward to the control action resulting in a high implement jerk movement of the virtual machine, and execute a learning algorithm to update the virtual machine operator model based on the positive reward or the negative reward.

In yet another aspect, an autonomous machine includes a frame, an engine supported on the frame, ground-engaging elements supported on the frame and driven by the engine to propel the autonomous machine, and a controller including autonomous controls for controlling the autonomous machine. The controller is programmed to execute a control action relative to the autonomous machine based on a machine operator model, and analyze a new state of the autonomous machine resulting from execution of the control action. The controller is also programmed to assign a positive reward or a negative reward to the control action based on the new state, and execute a learning algorithm to update the machine operator model based on the positive reward or the negative reward.

Other features and aspects will be apparent from the following description and accompanying drawings.

BRIEF DESCRIPTION OF THE DRAWINGS

FIG. 3 is a schematic representation of a neural network used for encoding a data representation of a virtual operator model, according to an aspect of the present disclosure;

FIG. 4 is a schematic representation of an exemplary control action, according to an aspect of the present disclosure;

FIG. 5 is a side view of the virtual machine, having a new state, according to an aspect of the present disclosure;

FIG. 6 illustrates a desired state of a bucket of the virtual machine and an analyzed new state of the bucket, according to an aspect of the present disclosure;

DETAILED DESCRIPTION

Figure 2:
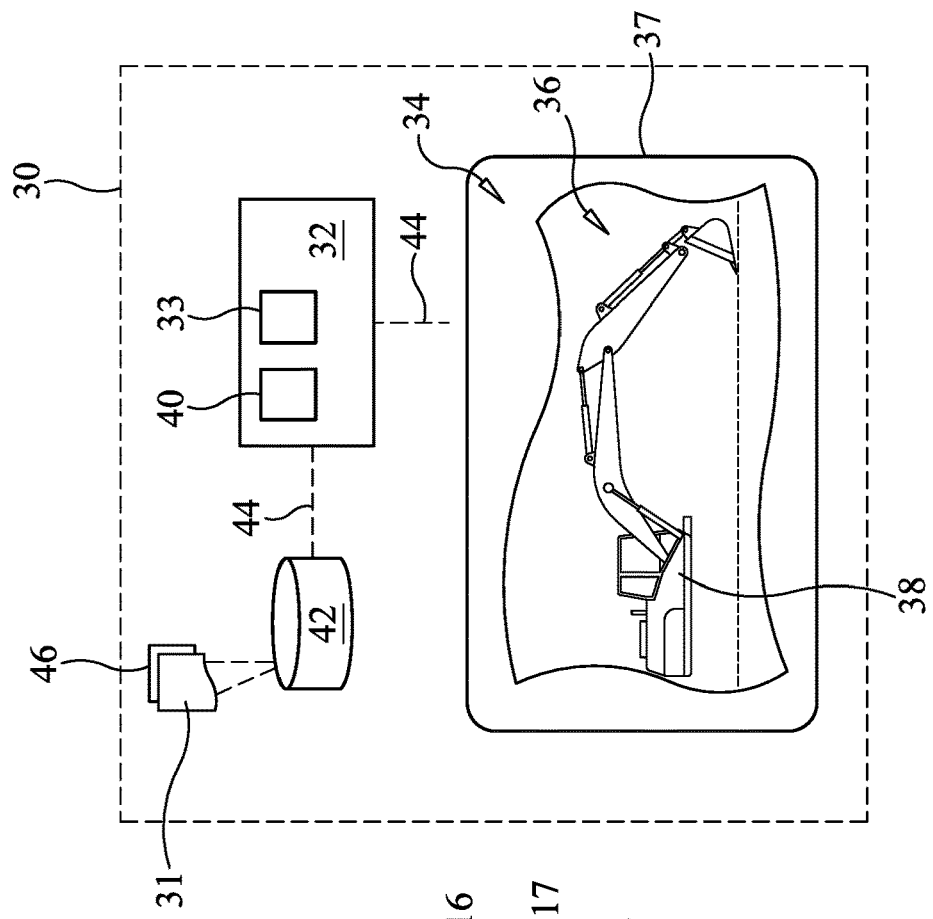
FIG. 2 is a side view of a virtual machine corresponding to the machine of FIG. 1, according to an aspect of the present disclosure.

Reference will now be made in detail to specific embodiments or features, examples of which are illustrated in the accompanying drawings. Wherever possible, corresponding or similar reference numerals will be used throughout the disclosure and accompanying drawings to refer to the same or corresponding parts.

Figure 1:
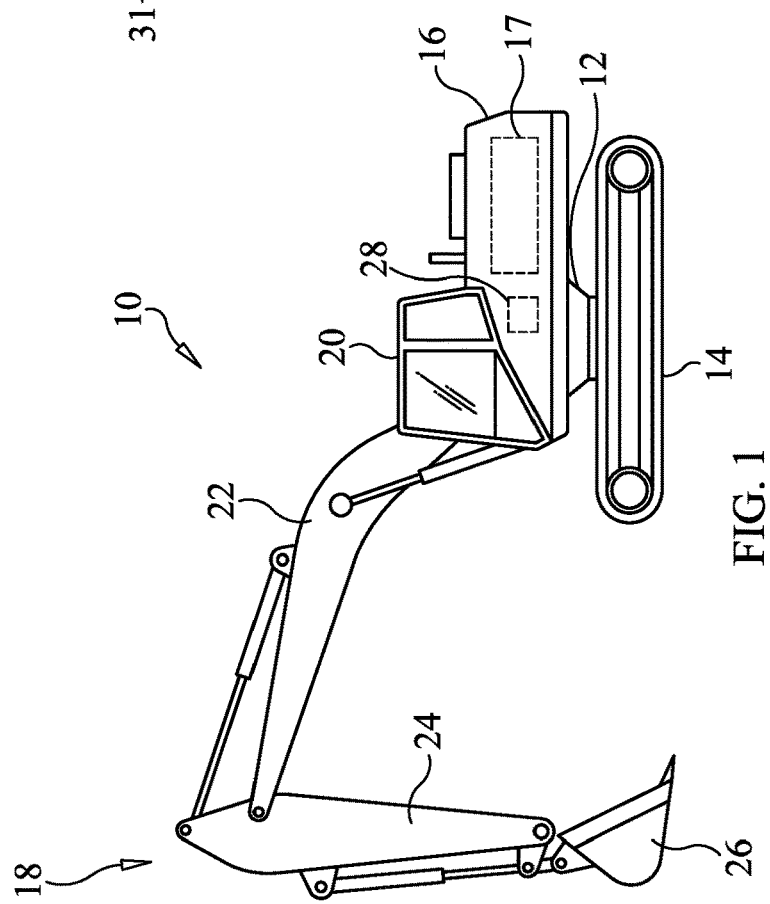
FIG. 1 is a side perspective view of a machine, according to an exemplary embodiment of the present disclosure.

An exemplary embodiment of a machine 10 is shown in FIG. 1. The machine 10 may be an excavator, as shown, or any other off-highway machine or on-highway machine. The machine 10 may be autonomous, semi-autonomous, or a conventional user-operated machine. The exemplary machine 10 includes a frame 12 supporting ground-engaging elements 14 and a machine body 16. An engine 17, or other power source, is also supported on the frame 12 for powering at least the ground-engaging elements 14 and an implement assembly 18.

The implement assembly 18, which is provided for exemplary purposes, generally includes a boom 22, a stick 24, and a work tool 26. The boom 22 may be pivotably attached to the frame 12, while the stick 24 may be pivotably attached to the boom 22. Hydraulic actuators may be used to reposition each of the boom 22, stick 24, and work tool 26 to perform an operation. Although the work tool 26 is illustrated as a bucket, the machine 10 may support any of a variety of different work tools, such as blades, forks, and the like for performing various work operations.

The machine 10 may also include an operator control station 20 housing various actuators and controls for facilitating operator control of the machine 10. In particular, for example, an operator may manipulate one or more actuators to electronically control components such as the ground-engaging elements 14 and the implement assembly 18 to perform work operations. A machine controller 28, supported on the machine 10, may receive signals from the actuators or controls, indicating desired control, and translate the signals into electronic commands for carrying out the desired control. The machine controller 28 may additionally or alternatively include autonomous controls for controlling autonomous machine applications.

Turning now to FIG. 2, a system 30 for using a virtual machine operator model 31, or policy, is illustrated. The system 30, which may be a computer system, may include a controller 32, which may include an electronic circuit and have a processor 33 configured to execute unique sets of instructions. The unique sets of instructions may be implemented as computer readable program code, stored in memory, such that the controller 32 may be configured as a special purpose device. In particular, for example, hardware, software, and particular sets of instructions may transform the controller 32 into the system 30 for using the virtual machine operator model 31 discussed herein.

The controller 32 may provide or generate a simulation 34 of a virtual machine operating environment 36. The virtual machine operating environment 36 may include at least a virtual machine 38, corresponding to the machine 10 of FIG. 1, and a virtual operator agent 40 acting, or controlling actions, within the virtual machine operating environment 36. That is, the virtual operator agent 40 may be a computer program that acts for the virtual machine operating environment 36 in a relationship of agency. The controller 32 may include the virtual operator agent 40 or may communicate with the virtual operator agent 40 via wireless or wired communications lines 44. According to some embodiments, the controller 32 and the virtual operator agent 40 may refer to the same component or device. Further, the controller 32 may communicate with a computer display 37, for displaying the virtual machine operating environment 36, and a database 42 via the communication lines 44.

The system 30 may be configured to simulate operation of the machine 10, with the virtual machine operator model 31 and virtual operator agent 40 being used to simulate movement of the virtual machine 38 within the virtual operating environment 36. That is, the virtual operator agent 40 may control movement of the virtual machine 38 based on control actions derived from the virtual machine operator model 31. The virtual machine operator model 31 may refer to a map of possible control actions for the virtual machine 38 that may be selected by the virtual operator agent 40. A data representation of the virtual machine operator model 31 may be encoded using a neural network 50, as shown in FIG. 3 as a first step in a decision cycle. The virtual machine operator model 31 may be stored in the database 42, along with a machine learning algorithm 46, which will be described in greater detail below.

The system 30 may utilize a simulation software that predicts the transient and frequency domain behavior of machines and machine systems, and integrates many types of systems, such as for example, hydraulic systems, engines, drivetrains, linkages, electronic controls, cooling systems, and the like. Further, the simulation software may contain a plurality of predefined components, such as, for example, torque converters, springs, spool valves, and the like, which may be graphically connected to build a mathematical model of the physical system. The resulting models may consist of a sub-system or an entire machine or machine system.

Referring also to FIG. 4, the virtual operator agent 40 may be configured to observe a current state of the virtual machine operating environment 36, which includes the virtual machine 38, and execute a control action 54 relative to the virtual machine 38 based on the virtual machine operator model 31 and the current state. According to the exemplary embodiment, the control action 54 may include instructions corresponding to commands for controlling manipulation of the implement assembly 18 of the virtual machine 38 in the virtual machine operating environment 36. The virtual operator agent 40 may, thus, transform the virtual machine operating environment 36 from the current state to a new state according to the control action 54. After the control action 54 has been executed, the new state of the virtual machine operating environment 36, including the virtual machine 38, as shown in FIG. 5, may be observed and analyzed. The observation may be comprised of measures that define the state of the virtual machine operating environment 36 and the virtual machine 38 and give the virtual operator agent 40 the ability to choose the next action going forward. For example, observations of the new state may include not only translational and angular position, but also velocity, acceleration, distance to other objects or fixed reference points, and even high-dimensional inputs such as, for example, images, video frames, and tactile sensors.

A reward may be assigned to the control action 54 based on the new state that is observed. The reward may be a cumulative, scalar, numerical value or score, and can be either positive or negative, with a goal of the virtual operator agent 40 being to maximize positive rewards. A "positive reward" is what we generally think of as a reward, while a "negative reward" is what we generally think of as a punishment. Balancing the different reward components by applying weights may be achieved through trial and error. Negative rewards may be assigned proportional to radial and angular deviations relative to a desired trajectory. According to the exemplary embodiment, for example, the reward may correspond to a difference between a desired state 56 and an analyzed new state 58. Rewards may include positive or negative scores and are intended to provide feedback regarding actions and, thus, shape future actions. That is, the virtual operator agent 40 will try to maximize rewards by selecting future actions from the virtual machine operator model 31 that are anticipated to bring the highest reward, based on rewards received in the past.

Further, a negative reward, or penalty, may be assigned to the control action 54 if the control action 54 results in a high implement jerk movement of the virtual machine 38. As will be discussed below, learning algorithms, which may be used to update the virtual machine operator model 31, may favor policies that result in "full stick positive" and "full stick negative" actions, which may create a high implement jerk movement. The high implement jerk movement may be an undesirable sharp or sudden movement of the implement. A negative reward may be used to control the jerk movement to reduce the occurrence of such movements.

The cycle illustrated in FIGS. 3-6 may be repeated continuously and, if desired, indefinitely. After a predetermined number of cycles, or episodes, have occurred, the learning algorithm 46 may be executed to update the virtual machine operator model 31 based on the positive and negative rewards. That is, future actions may be altered so that actions resulting in negative rewards are not repeated. According to a specific embodiment, the learning algorithm 46 may be a reinforcement learning algorithm or an evolutionary learning algorithm and may be executed after every twenty episodes.

The system 30 of the present disclosure may include additional or alternative features or enhancements without deviating from the intended scope. For example, the controller 32 may also be programmed to filter stochastic noise from the control action 54. The noise may be filtered by defining an online, low-pass digital signal processing filter which removes high-frequency components but keeps the low-frequency trend. According to one example, the filter may include an 8-pole infinite impulse response (IIR) Butterworth filter with a 0.5 Hz cutoff frequency implemented using cascaded second-order stages.

INDUSTRIAL APPLICABILITY

The system and method of the present disclosure relate generally to virtual environments for testing machines. In particular, the present disclosure is applicable to a system and method for using a virtual machine operator model, which is updated using a learning algorithm. The virtual machine operator model is accessed by a virtual operator agent, which issues control actions to a virtual machine in a virtual machine operating environment.

Referring generally to FIGS. 1-12, an exemplary machine 10 may include a frame 12 supporting ground-engaging elements 14 and a machine body 16. An engine 17 is also supported on the frame 12 for powering at least the ground-engaging elements 14 and an implement assembly 18. The machine 10 also includes an operator control station 20 housing various actuators and controls for facilitating operator control of systems and components of the machine 10.

The implement assembly 18, which is provided for exemplary purposes, generally includes a boom 22, a stick 24, and a work tool 26.

Product development regarding the machine 10 may benefit from running virtual simulations of new designs before any prototypes or production machines are built. By evaluating the performance and durability of various systems and/or components of the machine 10 using a virtual environment, designs may be optimized before any physical parts are constructed or assembled. It is important, however, that the simulation is operated in a manner that is representative of human operators.

Figure 7:
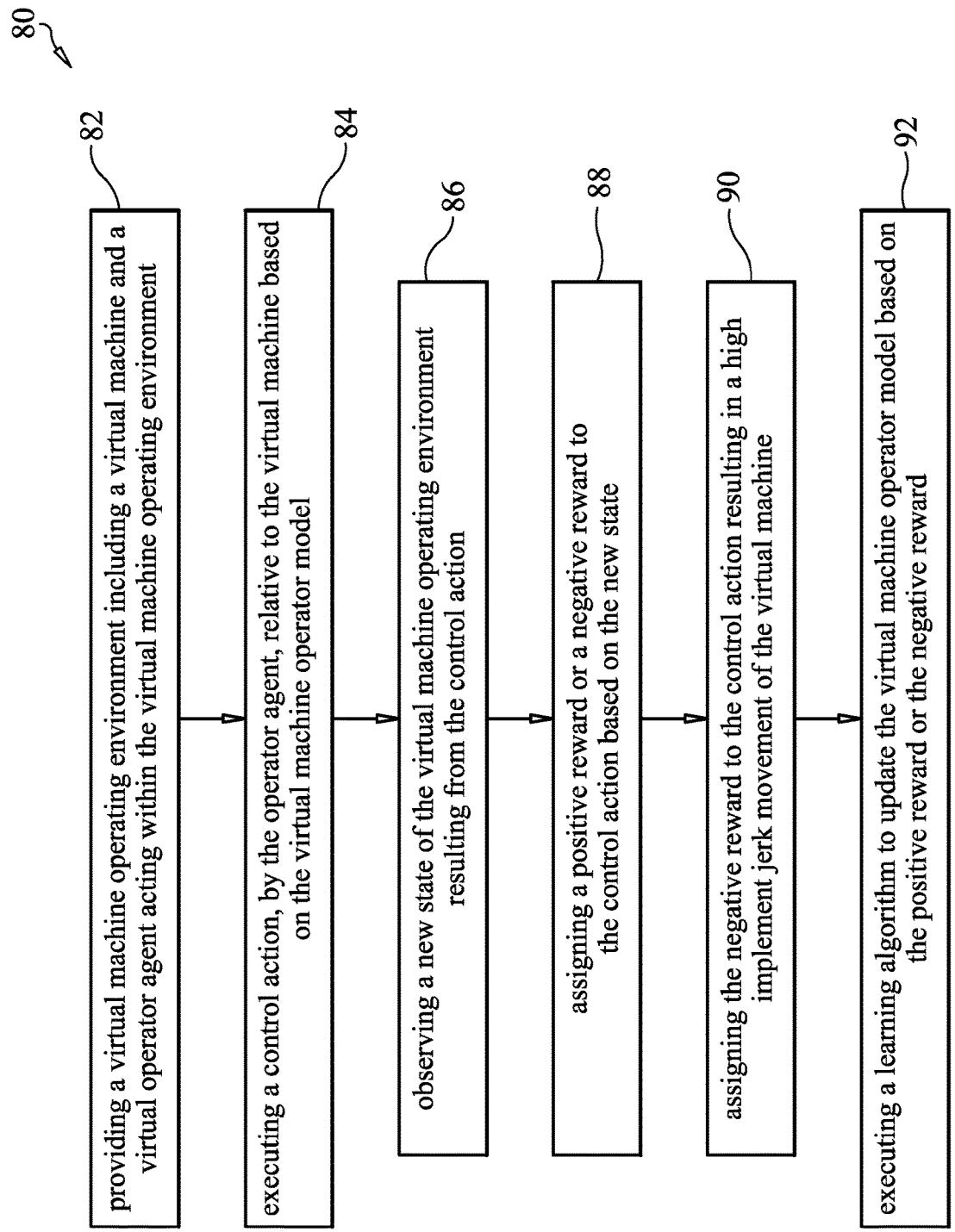
FIG. 7 is a flow diagram of an exemplary method for using the virtual machine operator model, according to the present disclosure.

Referring to FIG. 7, a flow diagram 80 illustrating an exemplary method for using a virtual machine operator model 31 is shown. The method may be implemented in whole or in part by a system 30 or, more specifically, a controller 32, and may run, or execute, continuously or intermittently. At a first step, at box 82, a virtual machine operating environment 36 may be provided. The virtual machine operating environment 36 may include a virtual machine 38, corresponding to machine 10, and a virtual operator agent 40, which may be or include the controller 32, acting within the virtual machine operating environment 36. The virtual machine operating environment 36, which includes the virtual machine 38, may have a current state, which may be analyzed or observed by the virtual operator agent 40.

At a next step, at box 84, a control action 54 relative to the virtual machine 38 and based on the current state and the virtual machine operator model 31 may be executed by the virtual operator agent 40. At box 86, a new state of the virtual machine operating environment 36, resulting from the control action 54, may be analyzed or observed. In particular, the virtual operator agent 40 may execute commands that transform the virtual machine operating environment 36 from the current state to a new state. For example, the control action 54 may include commands for moving the bucket of the virtual machine 38. A positive reward or a negative reward may be assigned to the control action 54, at box 88, based on the new state. According to a specific example, rewards may be assigned based on a deviation of the analyzed new state 58 to a desired state 56. That is, rewards may be assigned depending on whether or not the control action 54 produced the desired result. If the desired result was achieved the control action 54 will be "rewarded," and if the desired result was not achieved the control action 54 will be "punished" so that the behavior is not repeated.

These steps, also illustrated using a decision cycle diagram 52, may be repeated indefinitely or for a predetermined period of time. After a predetermined number of cycles, or episodes, a learning algorithm 46, such as, for example, a reinforcement learning algorithm, may be executed to update the virtual machine operator model 31 based on the accumulated positive rewards and negative rewards, at box 92. Specifically, the virtual machine operator model 31 may be optimized to maximize positive rewards.

Figure 8:
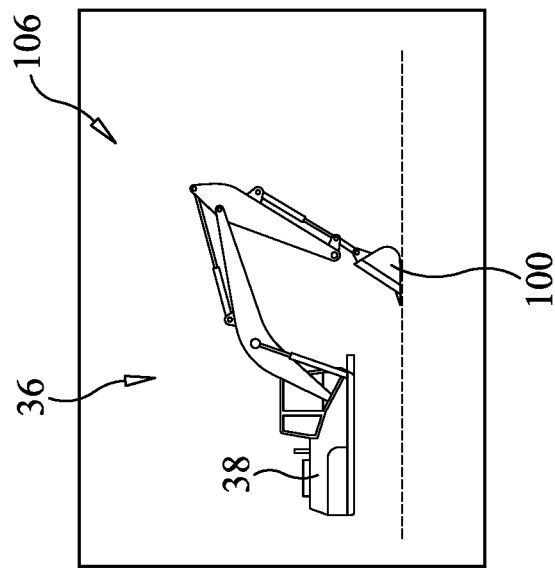
FIG. 8 illustrates the virtual machine at a first position or state, according to an aspect of the present disclosure.
Figure 9:
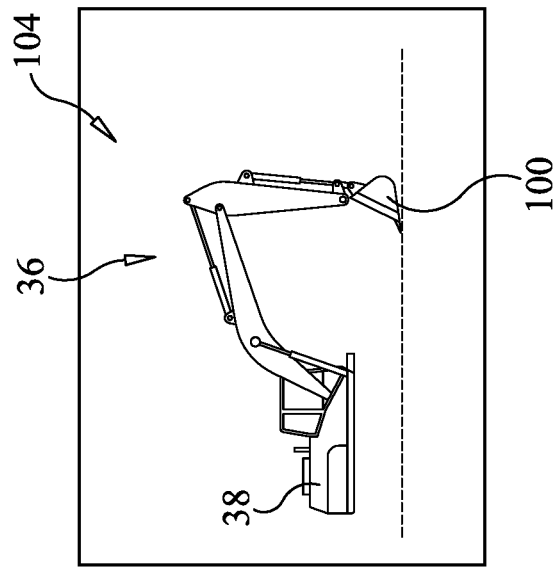
FIG. 9 illustrates the virtual machine at a second position or state, according to an aspect of the present disclosure.
Figure 10:
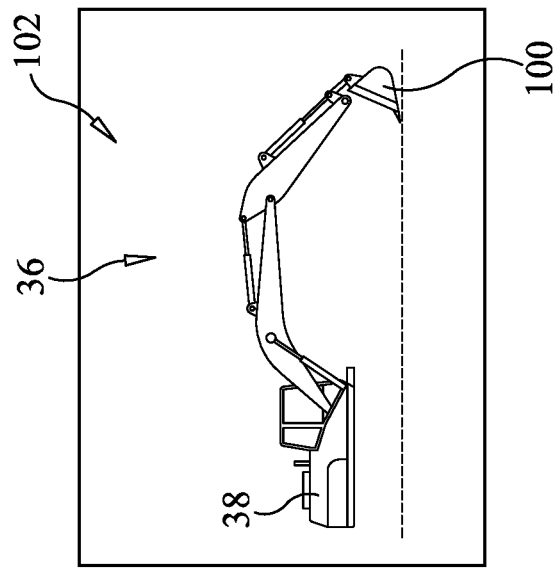
FIG. 10 illustrates the virtual machine at a third position or state, according to an aspect of the present disclosure.

Turning now to FIGS. 8-10, the virtual machine operating environment 36 is shown in three different states at 102, 104, and 106, illustrating simulation of a leveling, or bucket dragging, operation. The movement may be controlled using the virtual operator agent 40, and may include the state-action-reward cycle illustrated in FIGS. 3-6. The goal of leveling is to move a virtual bucket 100 from an extended position (FIG. 8), away from the virtual machine 38, to a retracted position (FIG. 10), close to the machine 38, while maintaining a constant position of the virtual bucket 100 relative to the ground using a sweeping motion. The three degrees-of-freedom must be varied simultaneously to achieve the desired results, which may be challenging, especially when hydraulic deadband, pump delays, joint friction, and ground engagement are added to the simulation.

Algorithms tend to favor policies that result in rapid movement of actuator commands, sometimes oscillating between full-stick negative and full-stick positive. This is a control problem and is known as "bang-bang" or "jerk" control. These bang-bang actions are likely optimal according to the learning algorithm, but smooth commands are desired for machine operation. Smooth controls are more human-like and will result in less severity on the machine hydraulic and structures. Therefore, to avoid the oscillation problem the reward function of the system 30 may be modified to punish this behavior.

However, for jerk control to be integrated, the noise must be passed through a low-pass digital filter before adding it to the commands. That is, the algorithm relies on adding Gaussian noise to the simulation actions in order to explore the search space. To allow the algorithm to work, the high frequency actions that would incur high jerk movement are removed while still allowing sufficient policy exploration.

Figure 11:
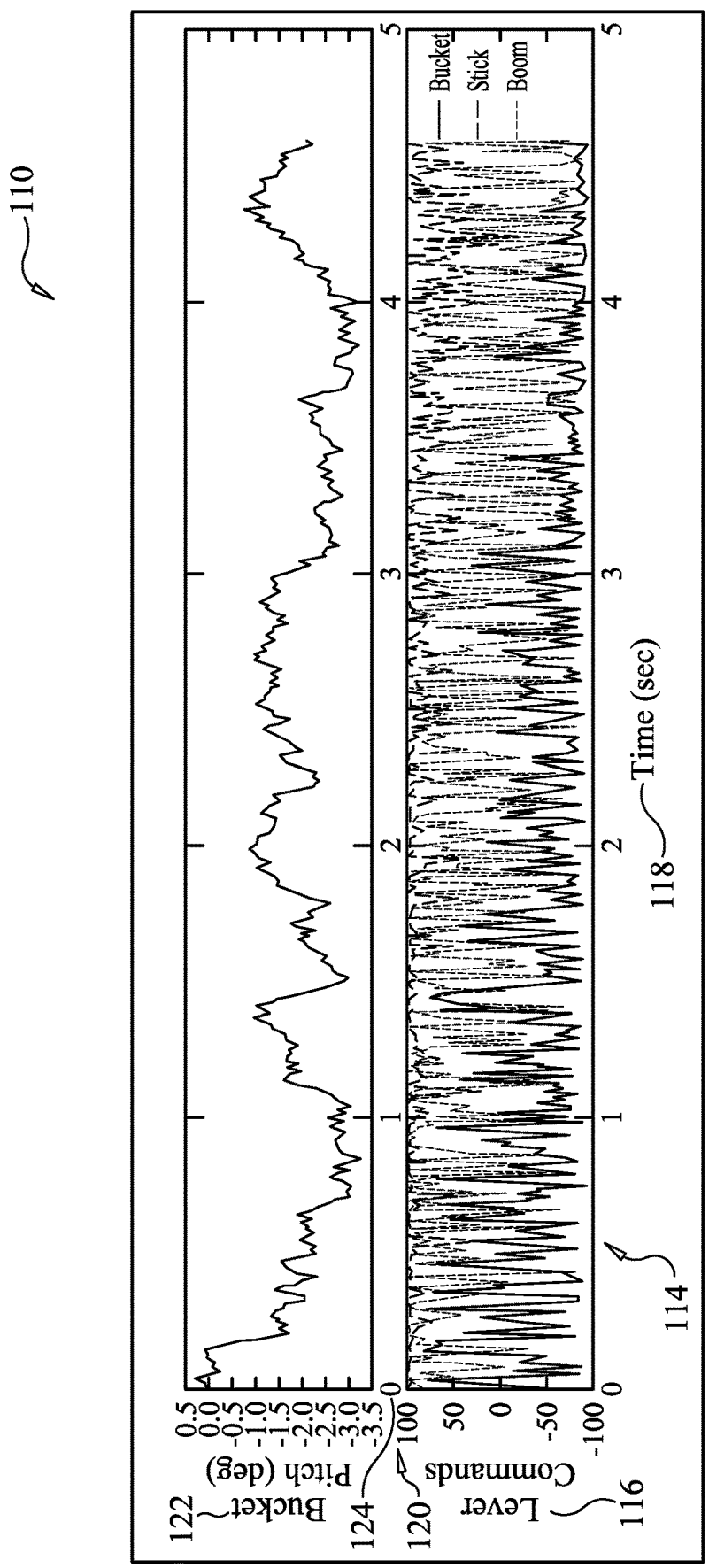
FIG. 11 is a pair of graphs of lever commands and corresponding bucket pitch over time, in an application without jerk control or noise filtering.
Figure 12:
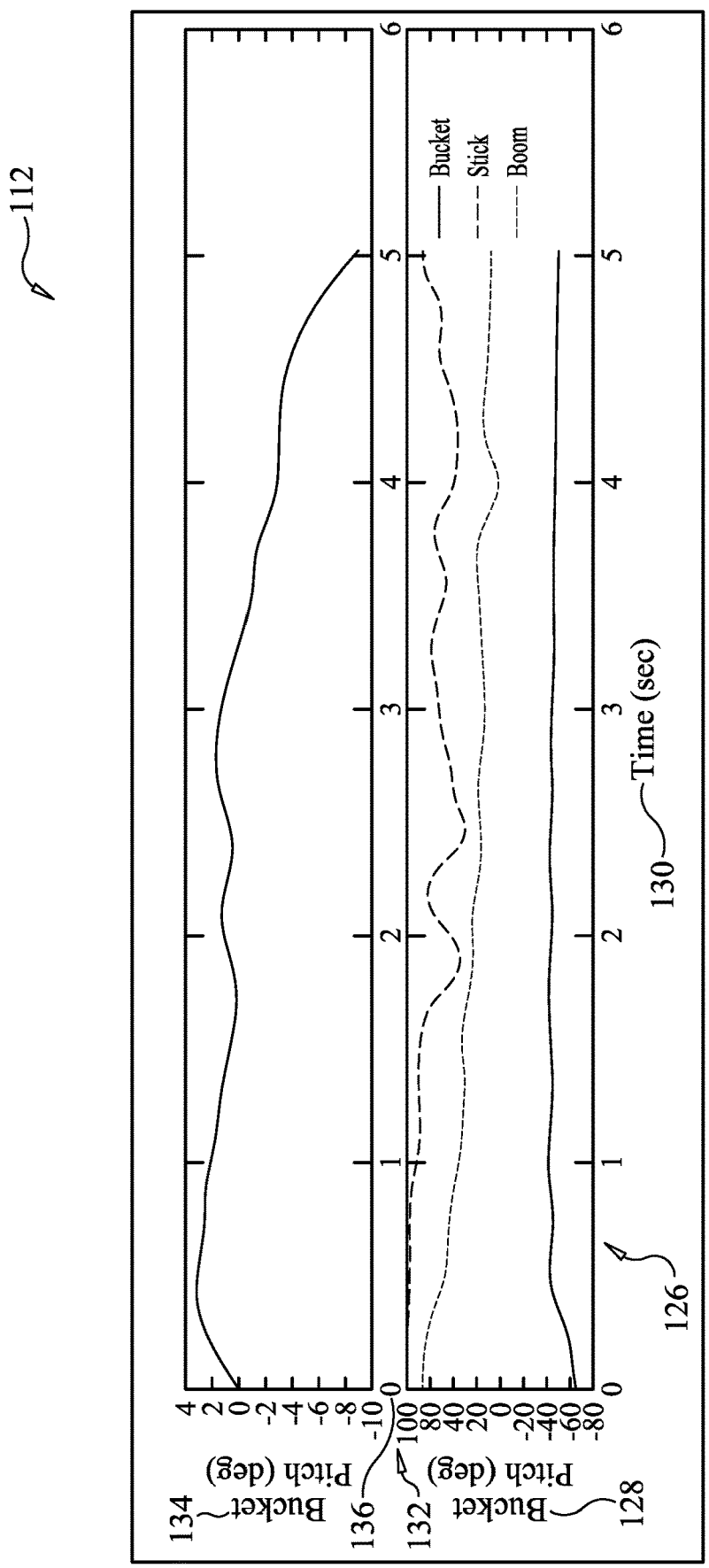
FIG. 12 is a pair of graphs of lever commands and corresponding bucket pitch over time, in an application with jerk control and noise filtering.

FIGS. 11 and 12 depict pairs of graphs 110 and 112 illustrating movements in an application without jerk control or noise filtering (FIG. 11) and an application with jerk control and noise filtering (FIG. 12). Referring to FIG. 11, movement of lever commands over time 114 are illustrated, with lever commands 116 depicted along the y-axis and time 118 depicted on the x-axis. Graph 110 also depicts a change in bucket pitch over time 120, with bucket pitch 122 depicted along the y-axis and time 124 depicted along the x-axis. Referring to FIG. 12, movement of lever commands over time 126 are illustrated, with lever commands 128 depicted along the y-axis and time 130 depicted on the x-axis. Graph 112 also depicts a change in bucket pitch over time 132, with bucket pitch 134 depicted along the y-axis and time 136 depicted along the x-axis. Movements illustrated without jerk control or noise filtering (FIG. 11) are abrupt and oscillate rapidly between extremes, while movements illustrated with jerk control and noise filtering (FIG. 12) are considerably smoother.

The system and method of the present disclosure provide a strategy for testing machines, or machine components, in a virtual environment. An operator agent may use observations of the current state of the virtual environment and a virtual machine operator model to issue control commands effecting a virtual machine. Positive or negative rewards are assigned to the action in an effort to improve the virtual machine operator model over time. As such, the virtual machine may be operated more realistically in the virtual environment, thus providing better simulations or testing. Jerk control and noise filtering may be integrated to optimize the virtual machine operator model for smoother machine operation. Beyond simply achieving good simulations, there is additional benefit that human-like simulations will drive better machine design and performance improvements.

Also, these virtual machine operator models can be deployed on an autonomous machine to support various operator-assist or machine autonomy solutions. That is, the operator model may be implemented on the machine, with the controller taking actions, assigning rewards, and improving the operator model. In this case, a virtual environment would not be necessary since the state of the actual machine may be utilized.

It should be understood that the above description is intended for illustrative purposes only, and is not intended to limit the scope of the present disclosure in any way. Thus, those skilled in the art will appreciate that other aspects of the disclosure can be obtained from a study of the drawings, the disclosure and the appended claims.

What is claimed is:

1. A method of using a virtual machine operator model, comprising:
    providing a processor connected to a memory;
    providing a virtual machine operating environment using a controller, wherein the virtual machine operating environment has a current state and includes a virtual machine and a virtual operator agent acting within the virtual machine operating environment;
    executing the following, using the controller, for a predetermined number of cycles:
        executing a control action, by the virtual operator agent, relative to the virtual machine based on the virtual machine operator model;
        analyzing a new state of the virtual machine operating environment resulting from execution of the control action;
        assigning a positive reward or a negative reward to the control action based on the new state; and
        assigning the negative reward to the control action resulting in a high implement jerk movement of the virtual machine; and
    executing a learning algorithm, using the controller, to update the virtual machine operator model based on the positive reward or the negative reward.

2. The method of claim 1, further including filtering stochastic noise from the control action using the controller.

3. The method of claim 1, further including encoding a data representation of the virtual machine operator model using a neural network.

4. The method of claim 1, further including executing one of a reinforcement learning algorithm and an evolutionary learning algorithm to update the virtual machine operator model.

5. The method of claim 1, wherein the virtual machine includes a boom, a stick, and a bucket.

6. The method of claim 5, wherein executing the control action includes issuing commands for controlling manipulation of one of the boom, the stick, and the bucket of the virtual machine.

7. The method of claim 1, wherein assigning the positive reward or the negative reward includes analyzing a difference between a desired state and the new state.

8. A system for using a virtual machine operator model, comprising:
    a processor connected to a memory;
    a controller programmed to:
        provide a virtual machine operating environment including a virtual machine and a virtual operator agent acting within the virtual machine operating environment, wherein the virtual machine operating environment has a current state;
        execute the following for a predetermined number of cycles:
            execute a control action, by the virtual operator agent, relative to the virtual machine based on the virtual machine operator model;
            analyze a new state of the virtual machine operating environment resulting from execution of the control action;
            assign a positive reward or a negative reward to the control action based on the new state; and assign the negative reward to the control action resulting in a high implement jerk movement of the virtual machine; and execute a learning algorithm to update the virtual machine operator model based on the positive reward or the negative reward.

9. The system of claim 8, wherein the learning algorithm is one of a reinforcement learning algorithm and an evolutionary learning algorithm.

10. The system of claim 9, wherein the controller is further programmed to filter stochastic noise from the control action.

11. The system of claim 9, wherein a data representation of the virtual machine operator model is encoded using a neural network.

12. The system of claim 9, wherein the virtual machine includes a boom, a stick, and a bucket.

13. The system of claim 12, wherein the control action includes commands for controlling manipulation of one of the boom, the stick, and the bucket of the virtual machine.

14. The system of claim 8, wherein the positive reward or the negative reward is based on a difference between a desired state and the new state.

15. An autonomous machine, comprising:
a processor connected to a memory;
a frame;
an engine supported on the frame;
ground-engaging elements supported on the frame and driven by the engine to propel the autonomous machine; and
a controller including autonomous controls for controlling the autonomous machine, the controller programmed to:
execute the following for a predetermined number of cycles:
execute a control action relative to the autonomous machine based on a machine operator model;
analyze a new state of the autonomous machine resulting from execution of the control action; and
assign a positive reward or a negative reward to the control action based on the new state; and
execute a learning algorithm to update the machine operator model based on the positive reward or the negative reward.

16. The autonomous machine of claim 15, wherein the controller is further programmed to assign the negative reward to the control action resulting in a high implement jerk movement of the autonomous machine.

17. The autonomous machine of claim 16, wherein the controller is further programmed to filter stochastic noise from the control action.

18. The autonomous machine of claim 15, wherein a data representation of the machine operator model is encoded using a neural network.

19. The autonomous machine of claim 15, wherein the autonomous machine includes a boom, a stick, and a bucket.

20. The autonomous machine of claim 15, wherein the learning algorithm is one of a reinforcement learning algorithm and an evolutionary learning algorithm.

* * * * *